United States Patent
Hörnig

(10) Patent No.: US 7,767,973 B2
(45) Date of Patent: Aug. 3, 2010

(54) SOLID-STATE DETECTOR AND METHOD FOR RESETTING RESIDUE CHARGES BY ILLUMINATION IN THE CASE OF A SOLID-STATE DETECTOR

(75) Inventor: Mathias Hörnig, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1009 days.

(21) Appl. No.: 11/500,927

(22) Filed: Aug. 9, 2006

(65) Prior Publication Data
US 2007/0034806 A1    Feb. 15, 2007

(30) Foreign Application Priority Data
Aug. 10, 2005    (DE)    ........................ 10 2005 037 898

(51) Int. Cl.
*H05G 1/64*    (2006.01)
(52) U.S. Cl. .............................. 250/370.09; 250/252.1; 378/98.7; 378/62
(58) Field of Classification Search ............ 250/370.01, 250/370.09, 252.1, 339.09; 205/370.09; 378/98.8, 98.7, 62
See application file for complete search history.

(56) References Cited

U.S. PATENT DOCUMENTS
6,359,965 B1    3/2002    Finkler et al.
6,753,661 B2 *  6/2004    Muthu et al. ................. 315/307
2003/0016352 A1   1/2003    Goldman et al.
2003/0020019 A1 * 1/2003    Wischmann et al. ... 250/370.09
2010/0053477 A1 * 3/2010    Hui et al. ..................... 348/755

FOREIGN PATENT DOCUMENTS
DE    199 34 980 A1    2/2001
DE    102 47 985 A1    4/2004

* cited by examiner

*Primary Examiner*—David P Porta
*Assistant Examiner*—Jessica L Eley
(74) *Attorney, Agent, or Firm*—Harness, Dickey & Pierce, P.L.C.

(57) ABSTRACT

For a uniform image quality of digital X-ray records, a solid-state detector is provided. The detector includes light-sensitive pixel elements arranged in an active matrix, and a reset light source arranged behind them in the radiation direction of X-ray radiation, with the reset light source being in the form of an arrangement with light-emitting diodes and with the light-emitting diodes being designed such that can be driven individually and their intensity can be controlled individually. At least one of a failed and malfunctioning light-emitting diode is detectable. The intensities of the serviceable light-emitting diodes are driven and controlled in the event of a failure or a malfunction of at least one light-emitting diode in such a manner that the intensity and/or the homogeneity of the reset light source remains the same.

20 Claims, 2 Drawing Sheets

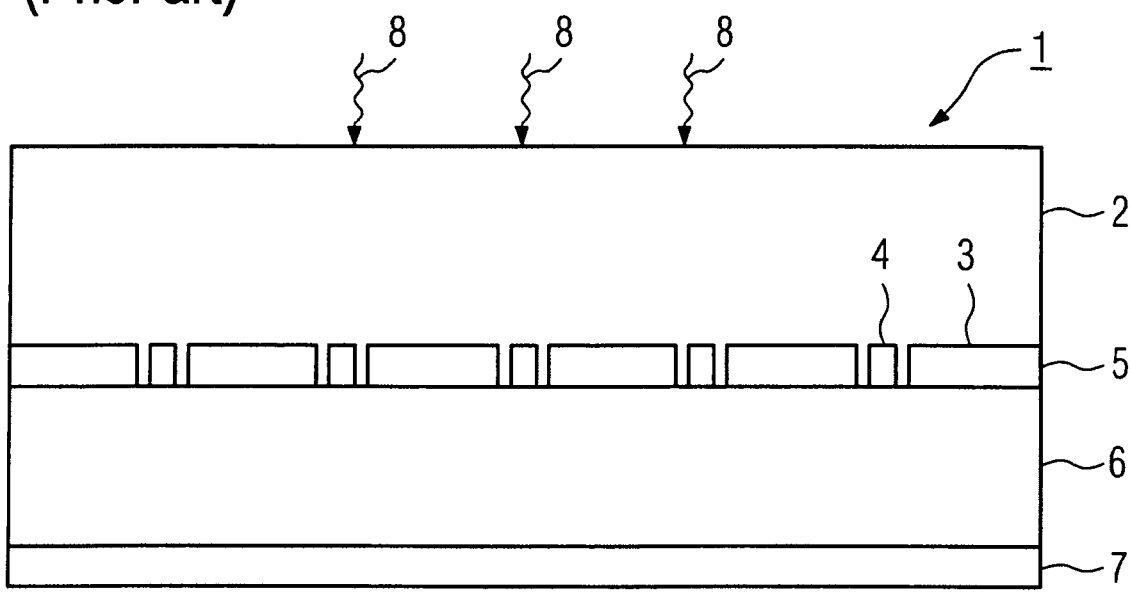

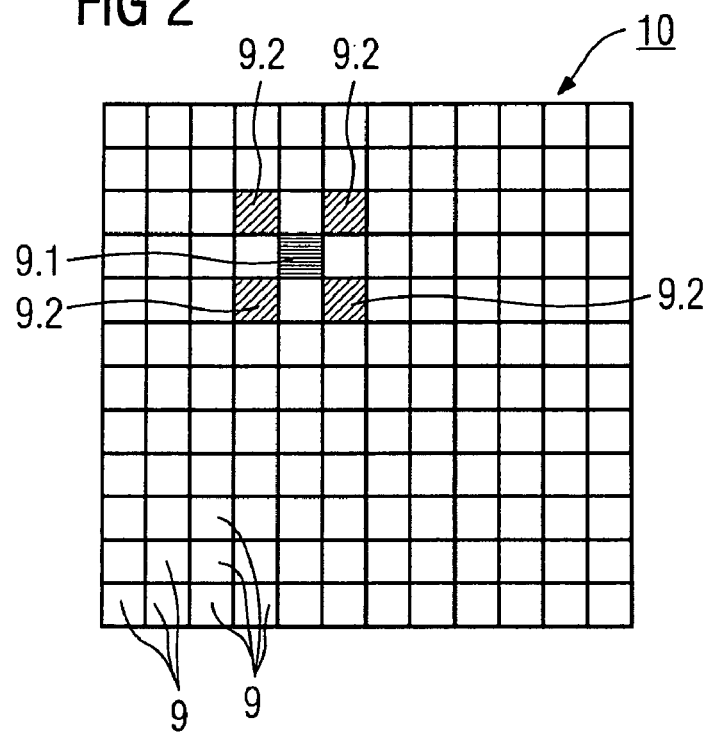
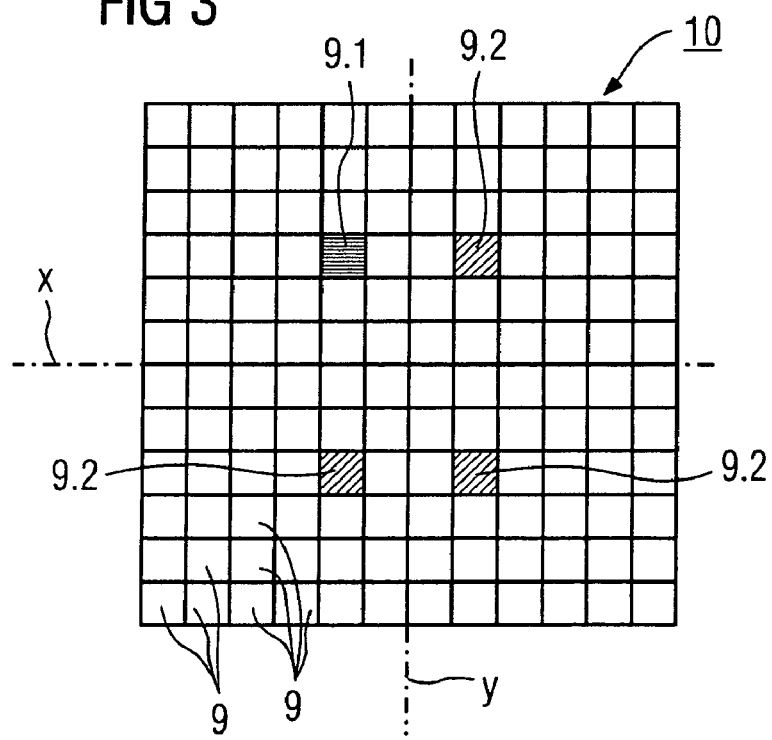

SOLID-STATE DETECTOR AND METHOD FOR RESETTING RESIDUE CHARGES BY ILLUMINATION IN THE CASE OF A SOLID-STATE DETECTOR

PRIORITY STATEMENT

The present application hereby claims priority under 35 U.S.C. §119 on German patent application number DE 10 2005 037 898.6 filed Aug. 10, 2005, the entire contents of which is hereby incorporated herein by reference.

FIELD

The invention generally relates to a solid-state detector. For example, it may relate to one including light-sensitive pixel elements which are arranged in an active matrix, and including a reset light source which is arranged behind them in the radiation direction of X-ray radiation, and/or to a method for resetting residual charges by illumination.

BACKGROUND

Solid-state detectors based on active reading matrices, for example composed of amorphous silicon (a-Si) with a scintillator layer coating in front of it have been known for many years. The incident X-ray radiation is converted to visible light in the scintillator layer, is converted to an electrical charge in light-sensitive pixel elements in the reading matrix, and is stored on a position-resolved basis.

Related technologies likewise use an active pixel matrix composed of amorphous silicon, but combined with an X-ray converter (for example selenium), which converts the incident X-ray radiation directly to an electrical charge. This is then stored on a position-resolved basis on an electrode in the reading matrix. The stored charge is then read electronically via an active switching element, is converted to digital signals, and is passed on to an electronic image processing system.

One physical characteristic of amorphous silicon which is critical to the image quality is the existence of deep energy levels (traps) which are filled with an electrical charge during recording of an image. The electrical charge is held in a comparatively stable manner in these traps because the energy level is particularly low, so that it is not possible to read all of the charge contained in the trap during the reading process which follows image recording. In fact, a certain proportion of the signal survives in a latent form in the trap and is only gradually released after the reading process. This can lead to a residual signal still being present when a subsequent recording is made, and also being read in the associated reading process. The most recently recorded X-ray image thus includes a residual signal from the previous recording. Among other phenomena, this results in contours from the previous recording appearing as shadows on the subsequent X-ray image. This effect is referred to as a ghosting artifact.

In order to reduce ghosting artifacts, it is known for a flat board composed of light-emitting diodes to be fitted as a reset light underneath the a-Si plate and for the amorphous silicon thus to be stabilized and homogenized by way of defined emitted light pulses.

A conventional X-ray diagnosis device may have a sensor composed of pixel elements and rear-face illumination by elements which are arranged in a matrix, with the output signal from the sensor being measured, and with the elements of the rear-face illumination, which comprise modules with light-emitting diodes which are arranged in the form of a matrix, being driven individually for homogenization by way of a control apparatus.

However, if any individual light-emitting diodes fail, then, in some cases, this can result in a non-uniform reset distribution, which is then reflected in the digital X-ray record.

SUMMARY

In at least one embodiment of the present invention, uniform image quality of digital X-ray records is achieved with a solid-state detector, even when individual light-emitting diodes are faulty.

In the solid-state detector according to at least one embodiment of the invention and the method according to at least one embodiment of the invention, the capability to drive and control the intensity of the light-emitting diodes individually allows the reset light source to be easily and effectively matched to different requirements and applications. It is thus possible to match the power of different light-emitting diodes to one another, or to substitute other light-emitting diodes for failed light-emitting diodes by intensity adaptation, so that it is possible to ensure that the digital X-ray records have a uniform image quality, without artifacts.

According to at least one embodiment of the invention, in the event of a failure or a malfunction of at least one light-emitting diode, the intensities of the serviceable light-emitting diodes are driven and controlled such that the intensity and/or the homogeneity of the reset light source remain/remains constant. A constant intensity ensures effective and error-free reduction of ghosting artifacts, and thus the image quality of the X-ray records is particularly good. A constant homogeneity of the reset light source ensures that switching artifacts are reduced or minimized, and thus likewise ensures that the image quality of the X-ray records is particularly good.

The light-emitting diodes advantageously have at least two intensity levels, and can be switched from a first intensity level to a second intensity level, and back. The different intensity levels and their control allow improved matching of the resetting process by the reset light source: if the resetting process is not adequate in the event of a low intensity level, then the intensity of the light-emitting diodes can be increased, while on the other hand their intensity can be reduced in order to save energy. Even better reset matching can be ensured by the intensity of the light-emitting diodes advantageously being continuously variable. This can be achieved, for example, by way of a potentiometer control.

According to one refinement of the method according to at least one embodiment of the invention, malfunctioning or failed light-emitting diodes are detected. Such detection forms the basis for deliberate and effective countermeasures in order to overcome a failure or a malfunction.

The intensities of at least some of the light-emitting diodes which are arranged adjacent to a failed or malfunctioning light-emitting diode are advantageously increased. This makes it possible to compensate for failed light-emitting diodes and, overall, prevents the image quality from being adversely affected by malfunctioning or failed light-emitting diodes. In order to compensate for the inhomogeneity of the reset light source which is caused by a malfunctioning or failed light-emitting diode, light-emitting diodes which are arranged symmetrically with respect to a failed light-emitting diode with respect to at least one axis of symmetry (x; y) of the active matrix (5) are switched off.

According to a further refinement of at least one embodiment of the invention, a reset light calibration is updated in the event of a failure or a malfunction of at least one light-emitting diode.

BRIEF DESCRIPTION OF THE DRAWINGS

The invention as well as further advantageous refinements according to features will be explained in more detail in the following text using example embodiments which are illustrated schematically in the drawing, without this restricting the invention to these example embodiments. In the figures:

FIG. 1: shows a lateral section through a solid-state detector with a reset light source according to the prior art;

FIG. 2: shows a plan view of a reset light source according to an embodiment of the invention with light-emitting diodes which can be driven individually, with one failed LED and with compensating LEDs; and FIG. 3: shows a plan view of a further reset light source according to an embodiment of the invention, with light-emitting diodes which can be driven individually, with one failed LED and with compensating LEDs.

DETAILED DESCRIPTION OF THE EXAMPLE EMBODIMENTS

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described.

FIG. 1 shows a solid-state detector 1 according to the prior art, which has a scintillator layer 2 comprising for example, a large number of CsI needles which are grown parallel. This scintillator layer 2 is coupled to an active pixel matrix 5, for example composed of amorphous silicon or crystalline silicon. The pixel matrix 5 includes a large number of individual pixel elements 3; 4 which each have a photodiode 3 with an associated switching element 4. The pixel matrix 5 is arranged on a mount 6, in this case a glass substrate. The solid-state detector 1 also has a conventional reset light source 7, which is arranged behind the mount 6 with respect to the radiation direction of X-ray radiation 8. The reset light source 7 is, for example, formed from a plurality of light-emitting diodes which are switched together. Reset light sources which are switched in areas of eight light-emitting diodes 8 are also already known from the prior art.

A solid-state detector according to at least one embodiment of the invention has a reset light source 10 composed of light-emitting diodes 9 which can be switched and controlled individually and whose intensity can be controlled. FIG. 2 shows a plan view of a reset light source 10 such as this with, for example, light-emitting diodes 9 which are arranged in the form of a matrix, as can be provided for a solid-state detector according to the invention. The individual light-emitting diodes 9 are switched and controlled by a switching and control unit, which may be integrated in the solid-state detector 1 or is arranged in an X-ray system with which the solid-state detector 1 for X-ray records is associated. By way of example, the light-emitting diodes 9 are arranged in such a manner that each light-emitting diode 9 is associated with one group of, for example, four or nine pixel elements 3; 4 in the active pixel matrix 5; however, it is also possible to provide only one pixel element 3; 4 for each light-emitting diode 9.

The solid-state detector 1 according to at least one embodiment of the invention has a device/method for detection of failed or malfunctioning light-emitting diodes 9.1. By way of example, this may be a sensor, which is provided for monitoring the light-emitting diodes 9. According to one refinement of at least one embodiment of the invention, malfunctioning or failed light-emitting diodes 9.1 are detected by reading an image from the pixel matrix 5 without X-ray radiation 8 with the reset light source 7 switched on and controlled at a uniform intensity, with the image being checked for a homogeneous signal distribution, and for pixel elements 3; 4 for which a signal decrease can be detected, which is identified for the light-emitting diode 9 associated with corresponding pixel elements 3; 4. Other methods are also possible, for example monitoring of the voltage drop across the light-emitting diodes 9.

According to one refinement of at least one embodiment of the invention, in the event of a failure or a malfunction of at least one light-emitting diode 9.1, the intensities of the serviceable light-emitting diodes 9.2 are driven and controlled in such a manner that the intensity and/or the homogeneity of the reset light source 10, which is composed of light-emitting diodes 9 which can be switched and controlled individually remains at least essentially constant. Two possible ways to compensate for the failure or the malfunction of a failed light-emitting diode 9.1 are illustrated in FIG. 2 and FIG. 3.

In FIG. 2, the light-emitting diodes 9, which are arranged in the form of a matrix, in the reset light source 10 and which include light-emitting diodes 9 which can be switched and controlled individually are set to 40% of their maximum intensity when the solid-state detector is switched on. After identification that a light-emitting diode 9.1 has failed, compensating light-emitting diodes 9.2 which are arranged adjacent to the failed light-emitting diode 9.1 are driven and their intensity is, for example, increased to 60%. This increase in the intensity of the compensating light-emitting diodes 9.2 compensates partially or completely for the loss of intensity which has resulted from the failed light-emitting diode 9.1 in the reset light source 10, which is composed of light-emitting diodes 9 which can be switched and controlled individually. The reset light source 10 which is composed of light-emitting diodes 9 which can be switched and controlled individually is then recalibrated. In the example, the failed light-emitting diode 9.1 is compensated for by the compensating light-emitting diodes 9.2 which are diagonally adjacent to it, although, for example, it is also possible for the intensity of all the adjacent light-emitting diodes, or of only one adjacent light-emitting diode, to be increased.

A further advantageous possible way to compensate for the failed light-emitting diode 9.1 is to switch off compensating light-emitting diodes 9.2 which are arranged symmetrically with respect to a failed light-emitting diode 9.1 with respect to the pixel matrix 5, as is shown in FIG. 3. Reflection above a first axis of symmetry x, above a second axis of symmetry y and about their intersection projects the failed light-emitting diode 9.1 onto the compensating light-emitting diodes 9.2. If they are switched off, the intensity distribution over the entire area of the reset light source 10, which is composed of light-emitting diodes 9 which can be switched and controlled individually, remains homogeneous. Compensation such as this is particularly advantageous when the reset light source 10 is used to prevent switching artifacts during an X-ray recording.

When operating correctly, the light-emitting diodes 9 are expediently switched to the lowest intensity level or to an intensity level of less than 50% of the maximum intensity. This results in the capability to increase the intensity of the compensating light-emitting diodes 9.2 in the event of a failure or a malfunction. It is, of course, also necessary to ensure at the same time that the light-emitting diodes 9 in the reset light source 10 which is composed of light-emitting diodes 9 which can be switched and controlled individually has an adequate intensity in order to ensure essentially complete resetting of residual charges by illumination of the pixel elements 3; 4. The light-emitting diodes 9 can also be operated as standard, for example on starting up the solid-state detector, at a low intensity level, or at a low intensity level below 50% of the maximum intensity.

According to a further refinement of at least one embodiment of the invention, the intensity of the remaining light-emitting diodes 9.2 is increased when the number of failed or malfunctioning light-emitting diodes 9.1 exceeds a predeterminable number. By way of example, if there are a plurality of intensity levels, the next intensity level is then selected or, if the intensity is continuously variable, it is increased, for example, by 10%. Furthermore, it is also possible to provide for the time for which the pixel elements 3; 4 are illuminated by the reset light source 7 to be increased.

In the event of a failure or a malfunction of at least one light-emitting diode 9.1, it is also possible to provide for a message to be passed to a control device for the X-ray system which is associated with the solid-state detector 1 in order, for example, to inform a user about the failure or the malfunction. In this context, it is also possible to provide documentation of the failures and, in a corresponding manner of the actions taken for compensation, for statistical purposes.

In addition to individual switching of the light-emitting diodes 9, they can also be switched in conjunction with intensity control on an area-by-area basis, that is to say for example in groups of two or four light-emitting diodes. In this case, failed or malfunctioning areas are then detected in a corresponding manner, with compensation being provided for areas such as these via an intensity increase or by switching off other areas.

At least one embodiment of the invention can be summarized briefly in the following way: in order to ensure a uniform image quality of digital X-ray recordings a solid-state detector 1 having light-sensitive pixel elements which are arranged in an active matrix and having a reset light source 10 which is arranged behind them in the radiation direction of X-ray radiation 8 are provided with the reset light source 10 being in the form of an arrangement of light-emitting diodes 9, and in which case the light-emitting diodes 9 can be driven, and their intensity can be controlled, individually and/or on an area-by-area basis.

According to one refinement of at least one embodiment of the invention, a means is provided for detection of failed or malfunctioning light-emitting diodes 9.1. According to a further refinement at least one embodiment, the intensities of the serviceable light-emitting diodes are driven and controlled in the event of a failure or a malfunction of at least one light-emitting diode 9 in such a manner that the intensity and/or the homogeneity of the reset light source 10 remains at least essentially constant.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A solid-state detector, comprising:
   light-sensitive pixel elements, arranged in an active matrix; and
   a reset light source, arranged behind the light-sensitive pixel elements in a radiation direction of X-ray radiation, the reset light source being in the form of an arrangement of light-emitting diodes and the light-emitting diodes being designed to be individually drivable and intensity of the light-emitting diodes being individually controllable, wherein intensities of the light-emitting diodes being driven and controlled in the event of at least one of a failure and a malfunction of at least one light-emitting diode in such a manner that at least one of intensity and homogeneity of the reset light source remains the same.

2. The solid-state detector as claimed in claim 1, wherein an at least partial increase in the intensity of light-emitting diodes arranged adjacent to a light-emitting diode which has failed is provided to compensate for the at least one of failure and malfunction of at least one light-emitting diode.

3. The solid-state detector as claimed in claim 1, wherein light-emitting diodes, arranged symmetrically with respect to at least one of a failed and malfunctioning light-emitting diode with respect to at least one axis of symmetry in the active matrix, are switched off to compensate for at least one of the failure and malfunction of at least one light-emitting diode.

4. The solid-state detector as claimed in claim 1, wherein the light-emitting diodes are drivable area-by-area.

5. The solid-state detector as claimed in claim 1, wherein the light-emitting diodes include at least two intensity levels and are switchable between a first intensity level to a second intensity level.

6. The solid-state detector as claimed in claim 5, wherein the light-emitting diodes are switched to the lowest intensity level when none of the light-emitting diodes has failed or has malfunctioned.

7. The solid-state detector as claimed in claim 1, wherein the intensity of the light-emitting diodes is continuously variable.

8. The solid-state detector as claimed in claim 7, wherein the light-emitting diodes are switched to an intensity level of less than 50% of the maximum intensity when none of the light-emitting diodes has failed or has malfunctioned.

9. The solid-state detector as claimed in claim 1, further comprising:
means for detection of at least one of failed and malfunctioning light-emitting diodes.

10. The solid-state detector as claimed in claim 9, wherein the means for detection of failed or malfunctioning light-emitting diodes includes a sensor.

11. The solid-state detector as claimed in claim 1, wherein the intensity of the remaining light-emitting diodes is increased when the number of failed or malfunctioning light-emitting diodes exceeds a threshold value.

12. The solid-state detector as claimed in claim 1, wherein a reset light calibration is updated in the event of at least one of a failure and malfunction of at least one light-emitting diode.

13. A method for resetting residual charges by illumination in a solid-state detector including a semiconductor layer with an active pixel matrix, and a reset light source, arranged behind the solid state detector and the semiconductor layer in a radiation direction of X ray radiation and formed from light-emitting diodes, with the intensity of the light-emitting diodes being drivable and controllable individually, the method comprising:
driving and controlling the intensities of the light-emitting diodes in the event of at least one of a failure and malfunction of at least one light-emitting diode in such a manner that at least one of the intensity and homogeneity of the reset light source remains the same.

14. The method as claimed in claim 13, further comprising:
detecting at least one of malfunctioning and failed light-emitting diodes.

15. The method as claimed in claim 13, wherein the intensity of at least some of the light-emitting diodes, arranged adjacent to a failed or malfunctioning light-emitting diode, is increased.

16. The method as claimed in claim 13, wherein light-emitting diodes, arranged symmetrically with respect to a failed or malfunctioning light-emitting diode, with respect to at least one axis of symmetry in the active matrix, are switched off.

17. The method as claimed in claim 13, with the light-emitting diodes are driven area-by-area.

18. The method as claimed in claim 13, wherein malfunctioning or failed light-emitting diodes are detected by reading an image from the active matrix without X-ray radiation, with the reset light source switched on and controlled at a uniform intensity, with the image being checked for a homogeneous signal distribution, and for pixel elements for which a signal decrease is detectable, which is identified for the light-emitting diode associated with the corresponding pixel elements.

19. The method as claimed in claim 13 using a solid-state detector.

20. A solid-state detector, comprising:
light-sensitive pixel elements, arranged in an active matrix; and
a reset light source, arranged behind the light-sensitive pixel elements in the radiation direction of X-ray radiation, the reset light source being in the form of an arrangement of light-emitting diodes and the light-emitting diodes being designed to be individually drivable and intensity of the light-emitting diodes being individually controllable; and
means for controlling and driving intensities of the light-emitting diodes in the event of at least one of a failure and a malfunction of at least one light-emitting diode in such a manner that at least one of intensity and homogeneity of the reset light source remains the same.

* * * * *